(12) United States Patent
Kawasaki (10) Patent No.: US 7,829,919 B2
(45) Date of Patent: Nov. 9, 2010

(54) SEMICONDUCTOR DEVICE (75) Inventor: Hisao Kawasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 12/368,557

(22) Filed: Feb. 10, 2009

(65) Prior Publication Data
US 2009/0242943 A1 Oct. 1, 2009

(30) Foreign Application Priority Data
Mar. 31, 2008 (JP) .............................. 2008-092706

(51) Int. Cl.
*H01L 29/812* (2006.01)
(52) U.S. Cl. ................. 257/279; 257/780; 257/E29.089
(58) Field of Classification Search ................. 257/279, 257/280, E29.317, E29.089, 192
See application file for complete search history.

(56) References Cited

FOREIGN PATENT DOCUMENTS

| JP | 04-91438 | 3/1992 |
|---|---|---|
| JP | 04-223342 | 8/1992 |
| JP | 5-299638 | 11/1993 |
| JP | 10-178189 | 6/1998 |
| JP | 11-186292 | 7/1999 |
| JP | 11-265898 | 9/1999 |
| JP | 2002-222817 | 8/2002 |
| JP | 2004-087587 | 3/2004 |
| JP | 2004-247709 | 9/2004 |
| JP | 2005-322811 | 11/2005 |
| JP | 2007-250792 A | 9/2007 |
| JP | 2008-306027 | 12/2008 |

OTHER PUBLICATIONS

Japanese Office Action, 2008-092706, mail date Jun. 8, 2010 5 pages.

*Primary Examiner*—Roy K Potter
(74) *Attorney, Agent, or Firm*—Oblon, Spivak, McClelland, Maier & Neustadt, L.L.P.

(57) ABSTRACT

A semiconductor device which can prevent peeling off of a gate electrode is provided. The semiconductor device has GaN buffer layer 12 formed on substrate 11, undoped AlGaN layer 13 formed on this buffer layer 12, drain electrode 16 and source electrode 17 formed separately on undoped AlGaN layer 13, which form ohmic junctions with undoped AlGaN layer 13. Between drain electrode 16 and source electrode 17, insulating layer 20 which has opening 19 is formed, and metal film 21 is formed on a surface of insulating layer 2. Gate electrode 18 which forms a Schottky barrier junction with undoped AlGaN layer 13 is formed in opening 19, and gate electrode 18 adheres to metal film 21.

11 Claims, 11 Drawing Sheets

SEMICONDUCTOR DEVICE

CROSS REFERENCE TO RELATED APPLICATION

This application is based upon and claims the benefit of priority from the Japanese Patent Application No. 2008-092706, filed on Mar. 31, 2008, the entire contents of which are incorporated herein by reference.

FIELD OF THE INVENTION

The present invention relates to a semiconductor device which operates at a high frequency band.

DESCRIPTION OF THE BACKGROUND

An FET (Field Effect Transistor) using compound semiconductors, such as GaN, has outstanding high frequency characteristics, and is widely put in practical use as a semiconductor device which operates at a microwave band.

This FET has the following structures, for example. That is, a GaN buffer layer is formed on a SiC substrate, and an undoped AlGaN layer which is an active layer is formed on the GaN buffer layer. On the undoped AlGaN layer, a drain electrode and a source electrode which consist of Ti/Al/Ni/Au are formed. The drain electrode and the source electrode form ohmic junctions with the undoped AlGaN layer. The drain electrode and the source electrode are formed by laminating Ti/Al/Ni/Au and removing an unnecessary portion by a lift-off method. Furthermore, between the drain electrode and the source electrode, a gate electrode which consists of Pt/Au or Ni/Au is formed. The gate electrode forms a Schottky barrier junction with the undoped AlGaN layer. The gate electrode is formed by laminating Pt/Au or Ni/Au and removing an unnecessary portion by the lift-off method.

Since a layer of a GaN system is a semiconductor layer which is bad in reactivity with Pt or Ni, in the FET mentioned above, adhesion of the AlGaN layer and Pt or the AlGaN layer and Ni is not so good. For this reason, when forming the gate electrode by the lift-off method, there was a problem that the formed gate electrode was peeled off.

In order to avoid this, a method of improving the adhesion of a gate electrode and a semiconductor substrate by forming the gate electrode with a vapor deposition rate of 2-20 Å/second is known (Japanese patent application publication No. HEI 10-178189).

When a gate length is shortened in order to make the FET highly efficient, a bonded surface of the AlGaN layer and the gate electrode becomes small. For this reason, there is a problem that it becomes difficult to acquire sufficient adhesion also by the method mentioned above.

SUMMARY OF THE INVENTION

According to one embodiment, it is provided a semiconductor device has a substrate, a buffer layer which is made from a material of a GaN system formed on the substrate, an active layer which is made from a material of a GaN system formed on the buffer layer, a drain electrode and a source electrode which are formed separately on the active layer and form ohmic junctions with the active layer, an insulating layer which is formed between the drain electrode and the source electrode and has an opening, a gate electrode which is formed in the opening and forms a Schottky barrier junction with the active layer, and a metal film which is formed on a surface of the insulating layer and is attached to the gate electrode firmly.

DETAILED DESCRIPTION OF THE INVENTION

Hereafter, the embodiments of the present invention will be explained with reference to FIG. 1 through FIG. 12.

Figure 1A:
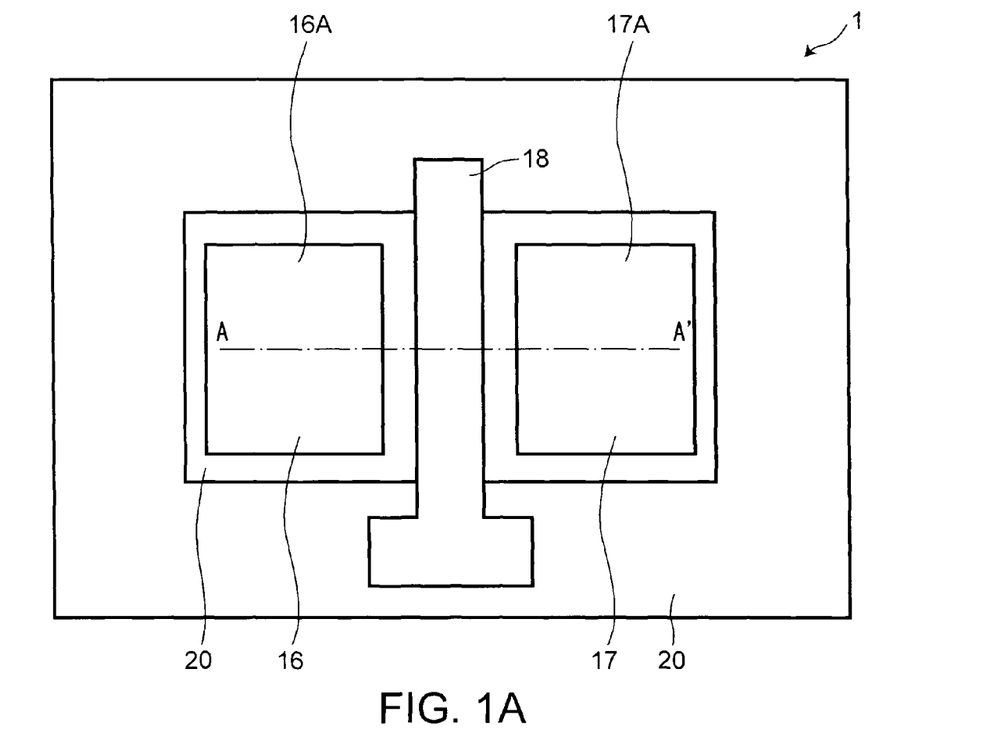
FIG. 1A is a top view showing a semiconductor device according to one embodiment.
Figure 1B:
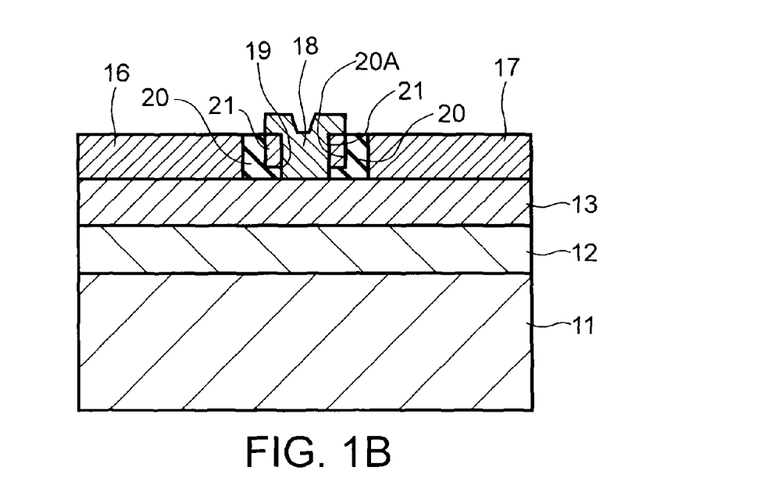
FIG. 1B is a cross-sectional view along dashed line A-A' of FIG. 1A.

FIG. 1A is a top view showing a structure of a semiconductor device according to this embodiment, and FIG. 1B is a cross-sectional view along dashed line A-A' of FIG. 1A.

In semiconductor device 1 shown in FIG. 1A and FIG. 1B, GaN buffer layer 12 which is made of a material of a GaN system is formed on SiC substrate 11, for example, and undoped AlGaN layer 13 which is an active layer and is made of a material of the GaN system is formed on GaN buffer layer 12. On undoped AlGaN layer 13, drain electrode 16 and source electrode 17 which form ohmic junctions with undoped AlGaN layer 13, respectively, are formed separately. Drain electrode 16 and source electrode 17 are formed of, for example, Ti/Al/Ni/Au. Between drain electrode 16 and source electrode 17, gate electrode 18 which forms a Schottky barrier junction with undoped AlGaN layer 13 is formed on undoped AlGaN layer 13. Gate electrode 18 is formed of, for example, Ni/Au.

Here, as for semiconductor device 1 according to this embodiment, insulating layer 20 is formed on undoped AlGaN layer 13, and openings 16A, 17A and 19 in which drain electrode 16, source electrode 17 and gate electrode 18 will be formed are formed in insulating layer 20. Insulating layer 20 is formed of silicon nitride, for example, SiN. Furthermore, on sidewall surface 20A of opening 19 in which gate electrode 18 will be formed, metal film 21 which consists of Ti is formed. Ti is excellent in adhesion with insulating layer 20 and is excellent also in adhesion with gate electrode 18.

Thus, in a semiconductor device according to this embodiment, metal film 21 which consists of Ti with good adhesion with gate electrode 18 which consists of Ni/Au, is formed on sidewall surface 20A of opening 19. For this reason, gate electrode 18 adheres to metal film 21, and gate electrode 18 is fixed firmly. Accordingly, gate electrode 18 can be prevented from being peeled off in a lift-off process at the time of forming gate electrode 18.

Next, with reference to FIG. 2A through FIG. 8B, a manufacturing method of the semiconductor device according to this embodiment will be explained.

Figure 2A:
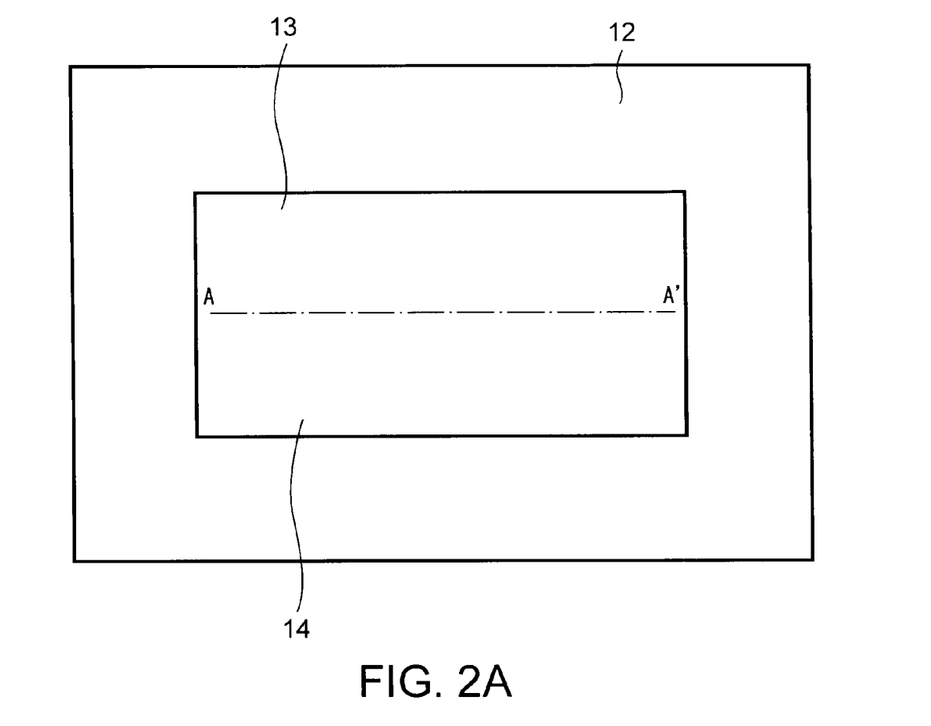
FIG. 2A is a top view showing a manufacturing process of the semiconductor device according to the embodiment.
Figure 2B:
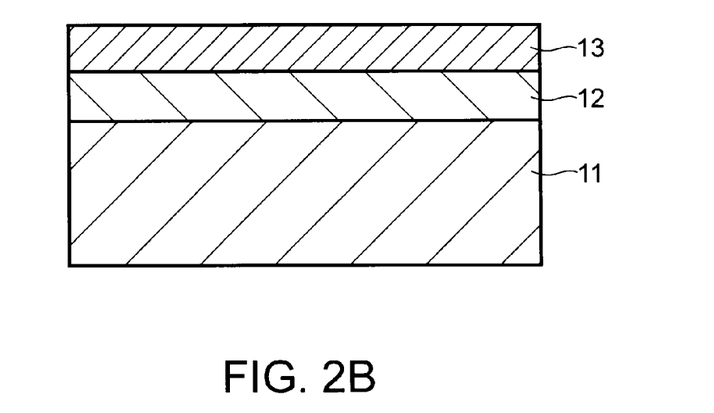
FIG. 2B is a cross-sectional view along dashed line A-A' of FIG. 2A.

First, as shown in FIG. 2A and FIG. 2B, a SiC substrate is used as substrate 11. On substrate 11, GaN buffer layer 12 and undoped AlGaN layer 13 are laminated in this order. Then, undoped AlGaN layer 13 is removed except for region 14 in which source electrode 16, drain electrode 17 and gate electrode 18 will be formed.

Figure 3A:
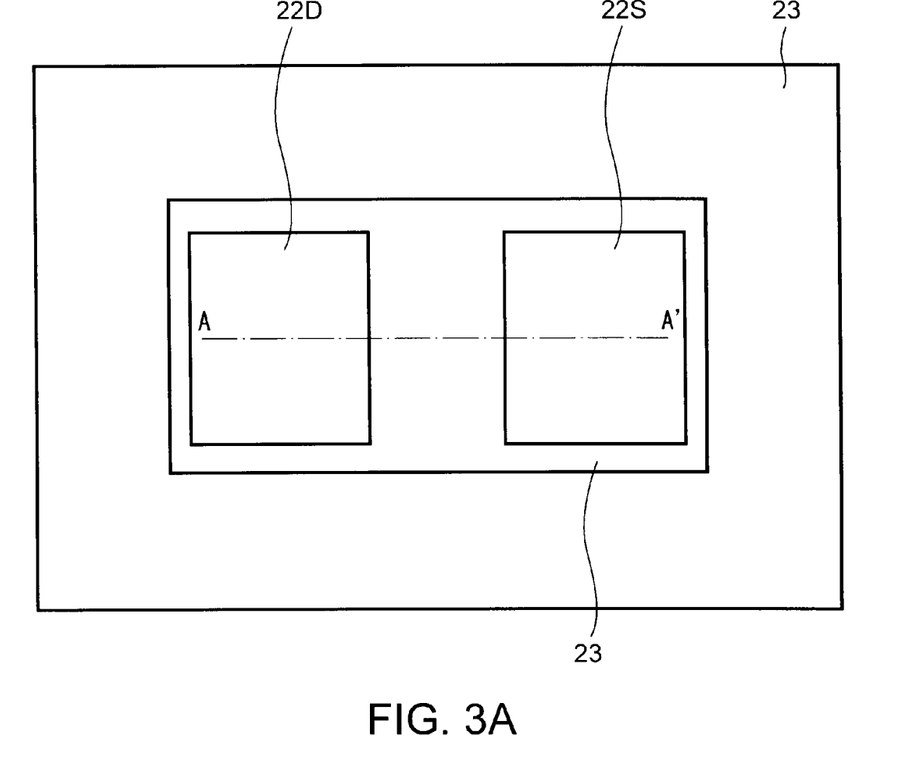
FIG. 3A is a top view showing the manufacturing process of the semiconductor device according to the embodiment.
Figure 3B:
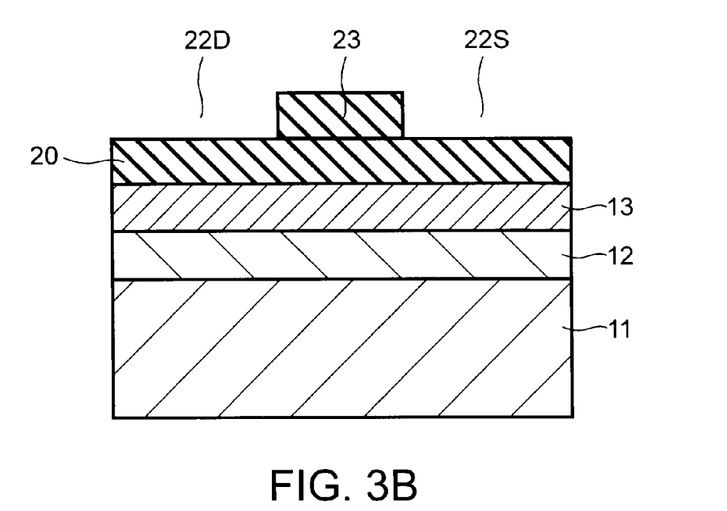
FIG. 3B is a cross-sectional view along dashed line A-A' of FIG. 3A.

Next, as shown in FIG. 3A and FIG. 3B, insulating layer 20 is formed on a surface of GaN buffer layer 12 and a surface of undoped AlGaN layer 13, and resist 23 is further formed on insulating layer 20. And openings 22D and 22S for forming drain electrode 16 and source electrode 17 are formed in resist 23.

Next, using resist 23 as a mask, insulating layer 20 is etched and openings 16A and 17A are formed in regions in which drain electrode 16 and source electrode 17 will be formed. Undoped AlGaN layer 13 is exposed in openings 16A and 17A.

Figure 4A:
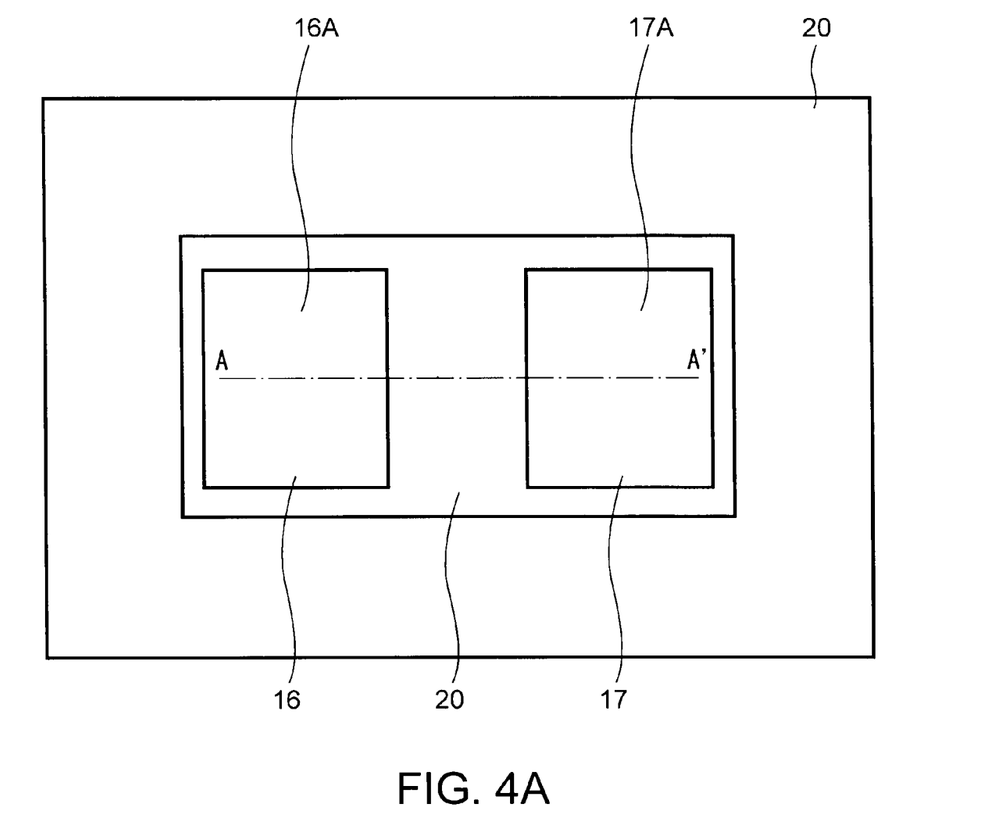
FIG. 4A is a top view showing the manufacturing process of the semiconductor device according to the embodiment.
Figure 4B:
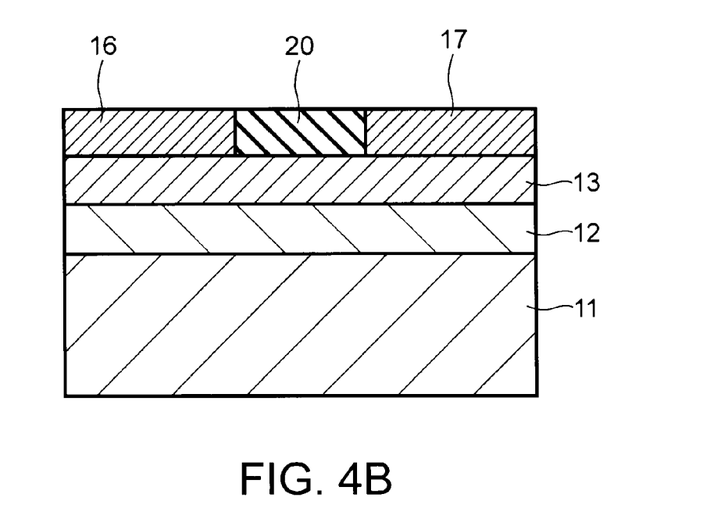
FIG. 4B is a cross-sectional view along dashed line A-A' of FIG. 4A.

Next, Ti, Al, Ni and Au are vapor-deposited in order. And by removing resist 23, as shown in FIG. 4A and FIG. 4B, drain electrode 16 and source electrode 17 which consist of Ti/Al/Ni/Au are formed. Drain electrode 16 and source electrode 17 form ohmic junctions with undoped AlGaN layer 13.

Figure 5A:
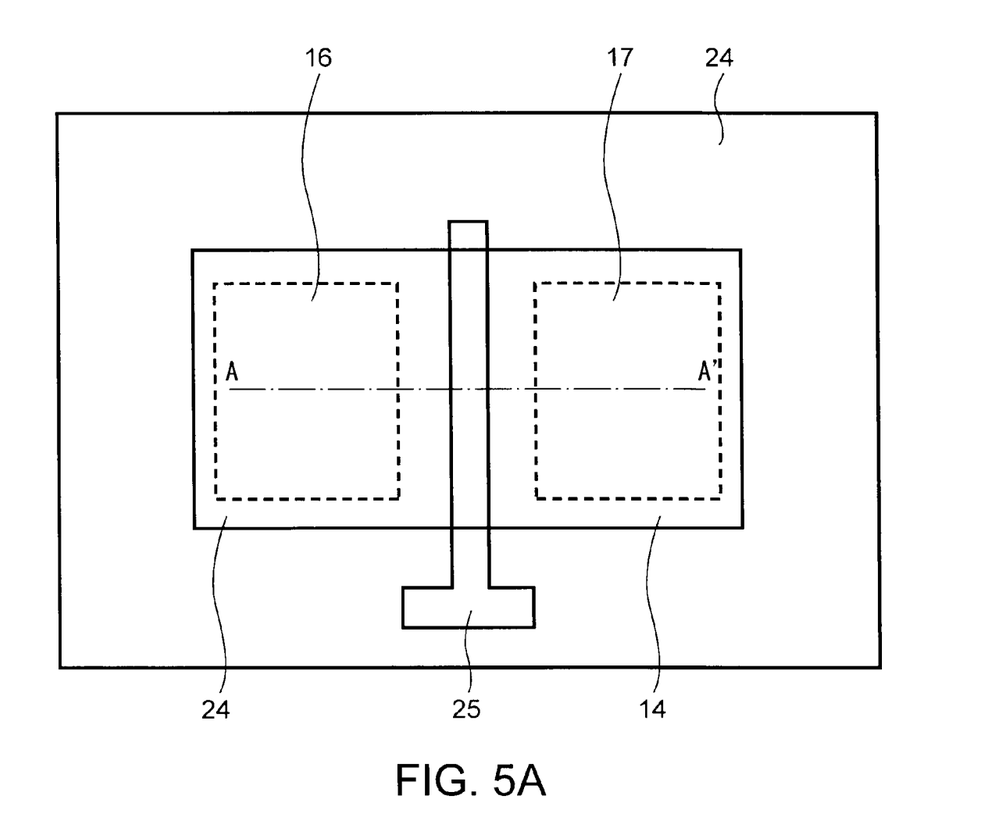
FIG. 5A is a top view showing the manufacturing process of the semiconductor device according to the embodiment.
Figure 5B:
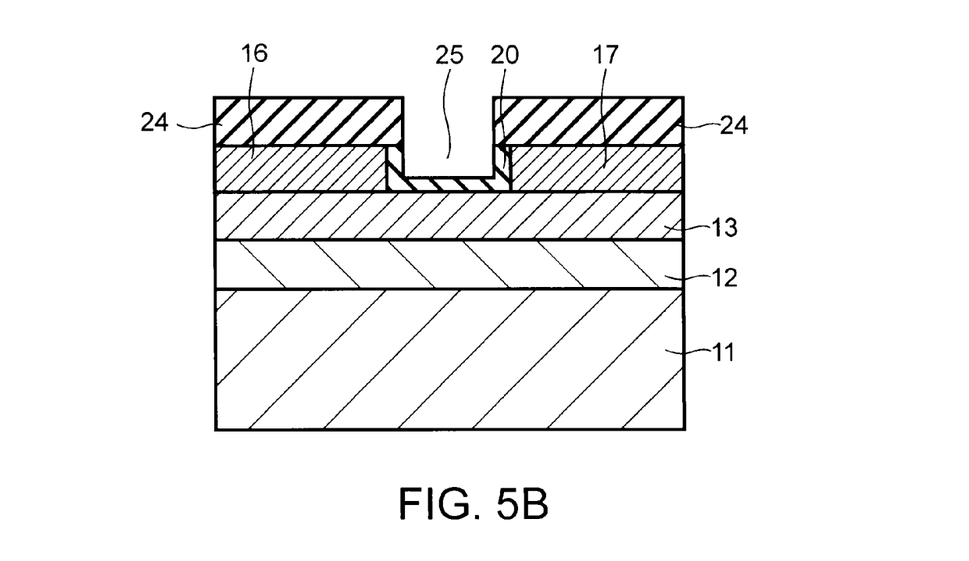
FIG. 5B is a cross-sectional view along dashed line A-A' of FIG. 5A.

Next, as shown in FIG. 5A and FIG. 5B, resist 24 is formed on a whole surface, and furthermore an opening is formed in a region in which formation of gate electrode 18 is planned at resist 24. In an opening, insulating layer 20 is exposed. Then, opening 25 is formed in insulating layer 20 by the RIE (Reactive Ion Etching) method. Opening 25 is extended outside region 14. Opening 25 does not penetrate insulating layer 20 and a depth of opening 25 does not reach undoped AlGaN layer 13 in region 14.

Figure 6A:
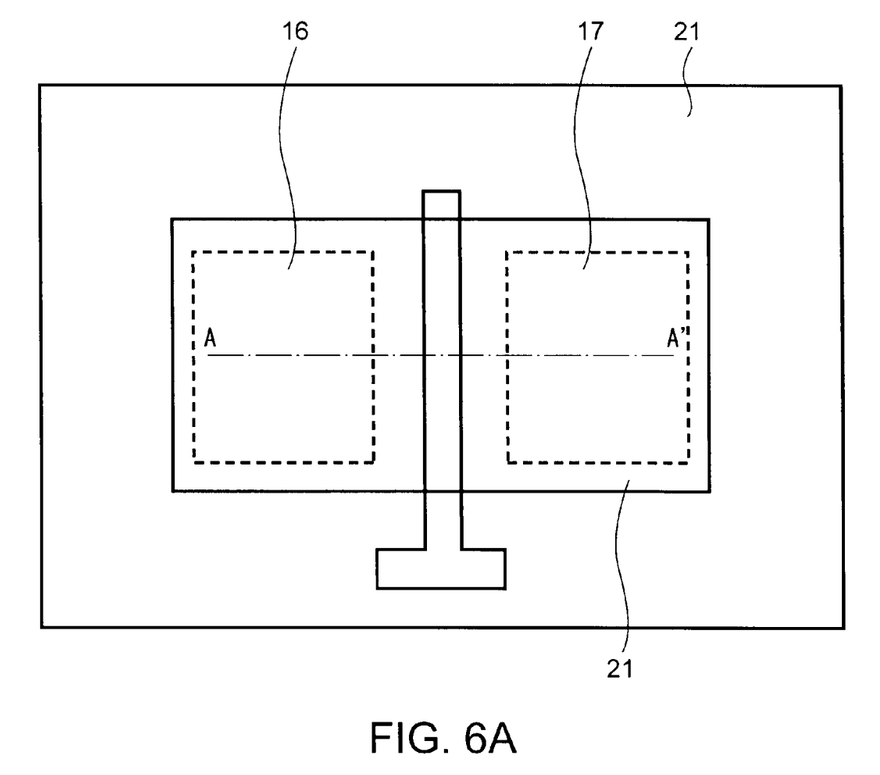
FIG. 6A is a top view showing the manufacturing process of the semiconductor device according to the embodiment.
Figure 6B:
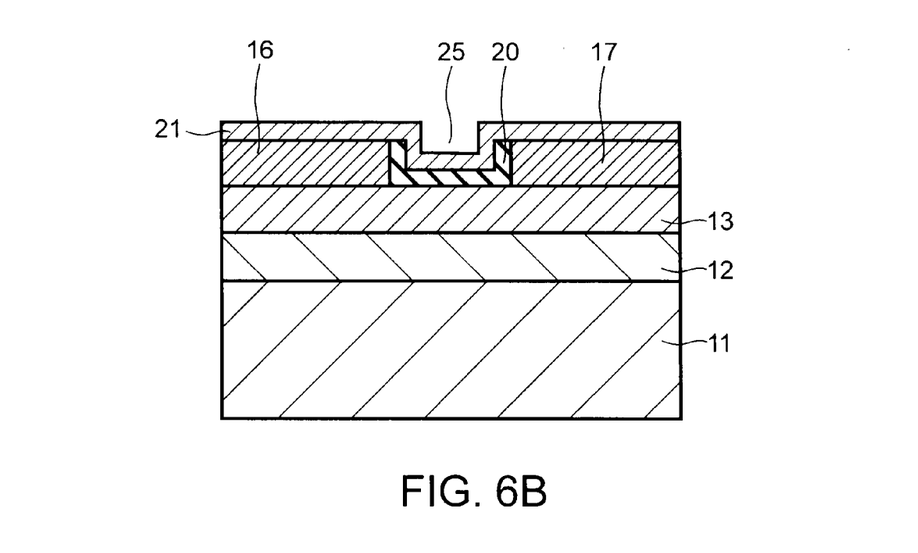
FIG. 6B is a cross-sectional view along dashed line A-A' of FIG. 6A.

Next, resist 24 is removed. Then, as shown in FIG. 6A and FIG. 6B, metal film 21 which consists of Ti is vapor-deposited on a whole surface.

Figure 7A:
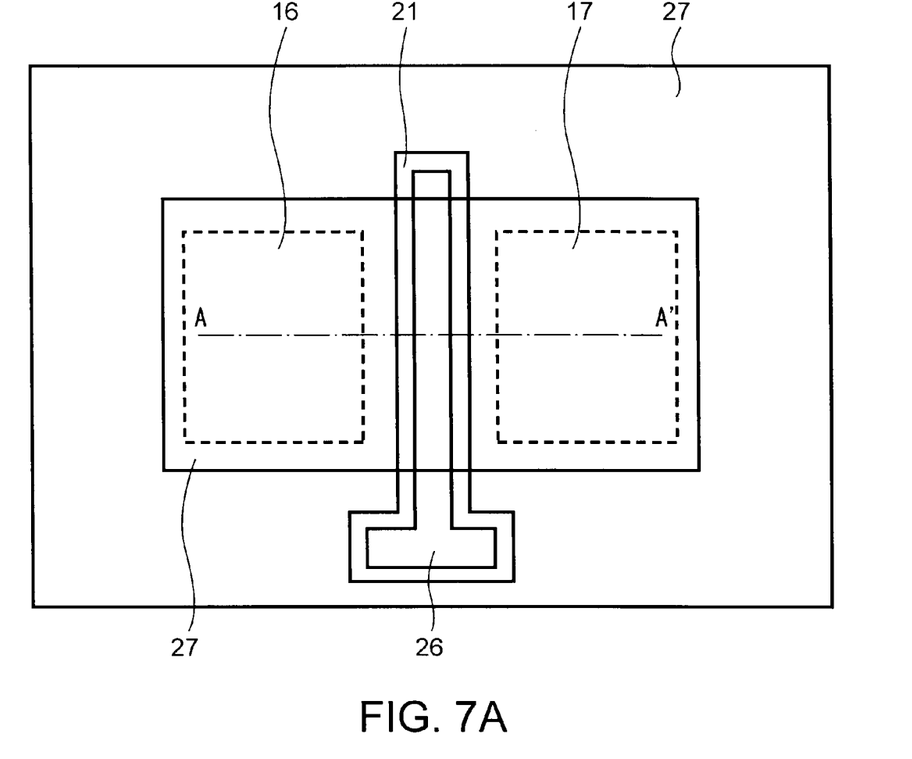
FIG. 7A is a top view showing the manufacturing process of the semiconductor device according to the embodiment.
Figure 7B:
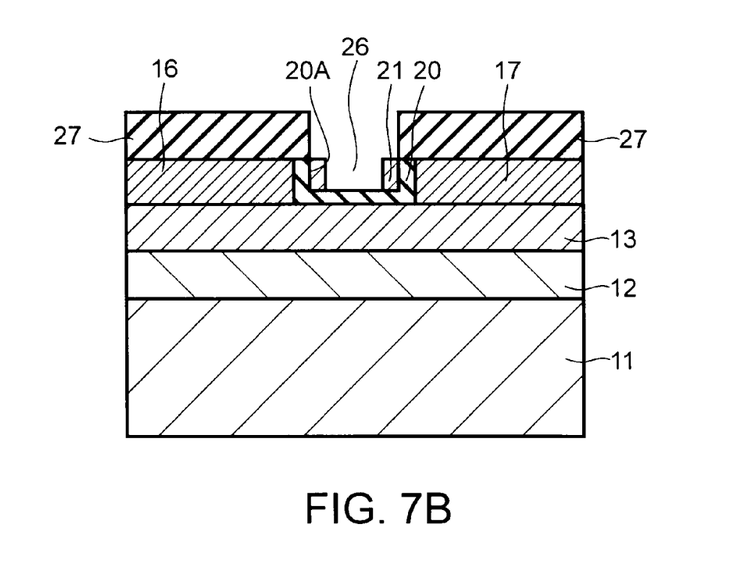
FIG. 7B is a cross-sectional view along dashed line A-A' of FIG. 7A.

Next, as shown in FIG. 7A and FIG. 7B, in opening 25, metal film 21 is left only on sidewall surface 20A of insulating layer 20 by etchback of metal film 21. Then, resist 27 is formed. Resist 27 has opening 26 in a region in which gate electrode 18 will be formed.

Figure 8A:
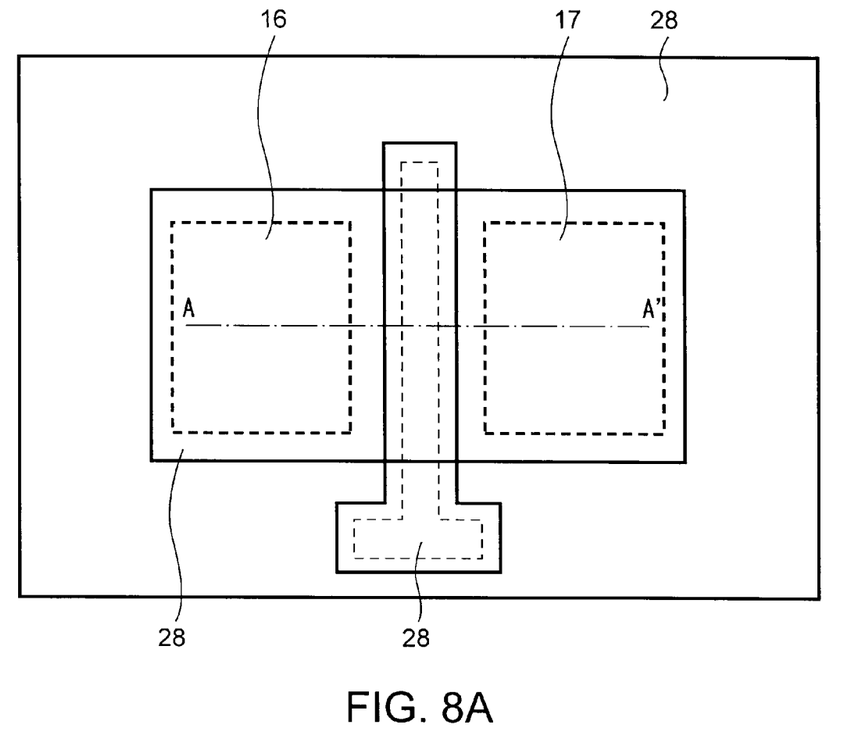
FIG. 8A is a top view showing the manufacturing process of the semiconductor device according to the embodiment.
Figure 8B:
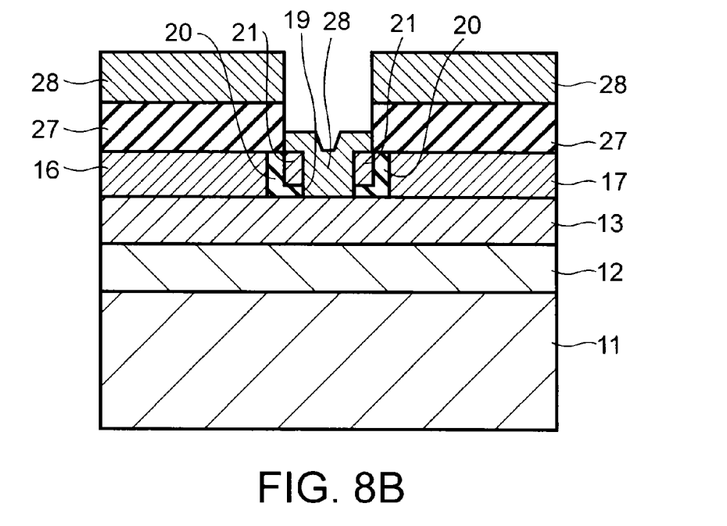
FIG. 8B is a cross-sectional view along dashed line A-A' of FIG. A.

Next, as shown in FIG. 8A and FIG. 8B, opening 19 for gate electrode formation is formed by etching and removing insulating layer 20 existing at the lower part of opening 25 by using resist 27 as a mask. Undoped AlGaN layer 13 is exposed by opening 19. Metal film 21 is not etched by this etching. Then, Ni/Au 28 is formed on a whole surface by vapor-depositing Ni and Au in order.

Finally, by removing resist 27, as shown in FIG. 1A and FIG. 1B, gate electrode 18 which consists of Ni/Au is formed, and semiconductor device 1 is manufactured. Gate electrode 18 forms the Schottky barrier junction with undoped AlGaN layer 13. Since gate electrode 18 has good adhesion with metal film 21, gate electrode 18 adheres to metal film 21, and is fixed firmly. For this reason, when removing resist 27, gate metal 18 can be prevented from being peeled off.

Gate electrode 18 is extended and formed on buffer layer 12 in which undoped AlGaN layer 13 is not formed. For a wire bonding process given later, width of gate electrode 19 formed on buffer layer 12 is formed more widely than width of gate electrode 18 formed on undoped AlGaN layer 13.

Next, semiconductor devices according to other embodiments will be explained. In a following explanation, the same reference numbers are attached to the same parts or equivalent parts as the above-mentioned embodiment, and detailed explanations will be omitted.

Figure 9A:
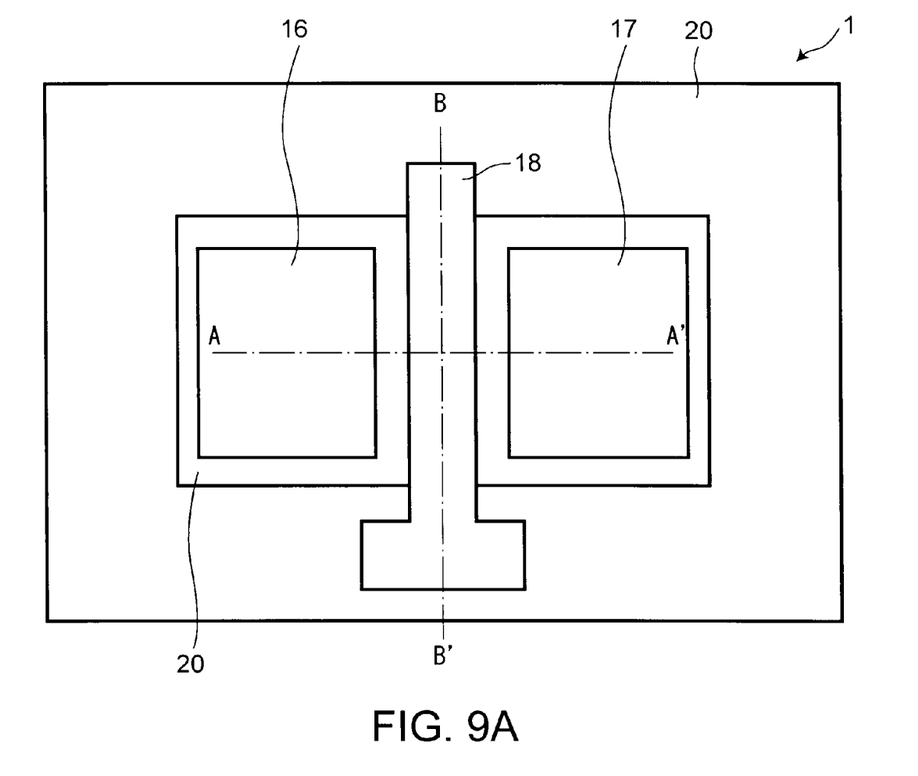
FIG. 9A is a top view showing a semiconductor device according to another embodiment.
Figure 9B:
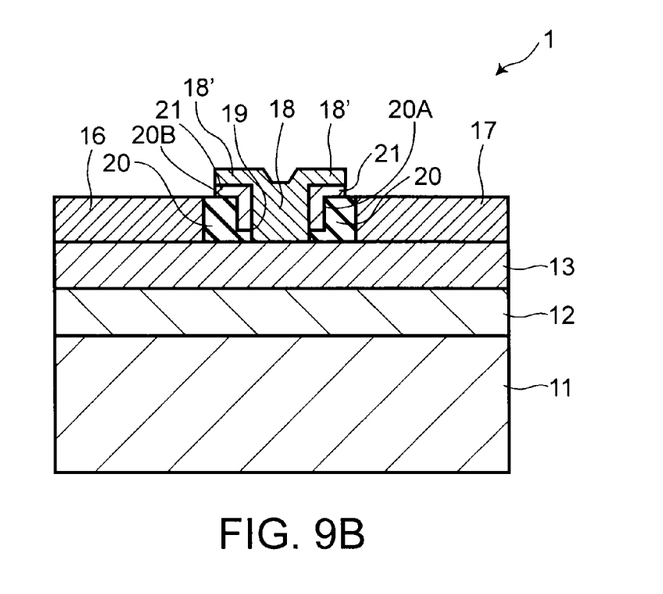
FIG. 9B is a cross-sectional view along dashed line A-A' of FIG. 9A.

In semiconductor device 1 of an embodiment shown in FIG. 9A and FIG. 9B, overhang portion 18' of gate electrode 18 is formed above surface 20B of insulating layer 20. Metal film 21 which consists of Ti is formed on sidewall surface 20A of opening 19 of insulating layer 20 and on surface 20B of insulating layer 20 under overhang portion 18' of gate electrode 18. By forming metal film 21 like this, gate electrode 18 and metal film 21 adhere and are fixed in an area larger than the embodiment mentioned above. For this reason, gate electrode 18 fixed more firmly can be formed. In this embodiment, overhang portion 18' of gate electrode 18 is line symmetrical with respect to center line B-B' of a region where gate electrode 18 contacts undoped AlGaN layer 13.

Figure 10A:
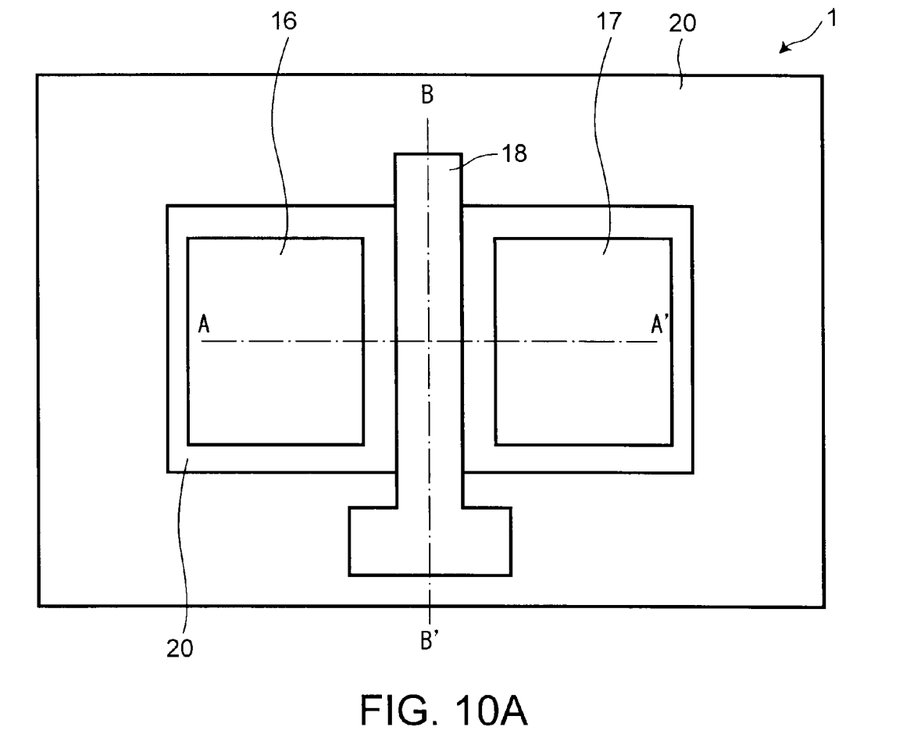
FIG. 10A is a top view showing a semiconductor device according to another embodiment.
Figure 10B:
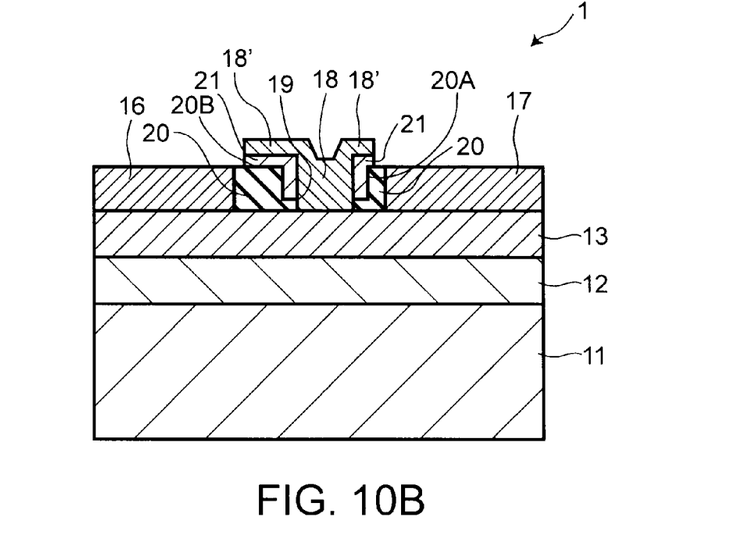
FIG. 10B is a cross-sectional view along dashed line A-A' of FIG. 10A.

In semiconductor device 1 of an embodiment shown in FIG. 10A and FIG. 10B, overhang portion 18' of gate electrode 18 is asymmetrical with respect to center line B-B' of a region where gate electrode 18 and undoped AlGaN layer 13 contact. For example, an overhang length of overhang section 18' of drain electrode 16 side is formed longer than an overhang length of overhang portion 18' of source electrode 17 side. Also in this embodiment, metal film 21 which consists of Ti is formed on sidewall surface 20A of opening 19 of insulating layer 20 and on surface 20B of insulating layer 20 under overhang portion 18' of gate electrode 18. Therefore, as for this embodiment, an effect of the present invention is obtained. In this embodiment, concentration of an electric field at gate electrode 18 edge can also be prevented by a field plate effect.

Figure 11:
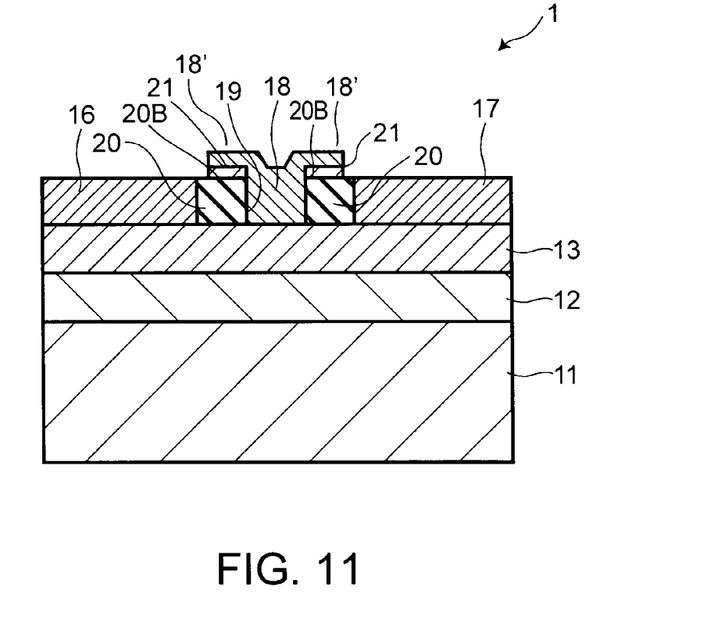
FIG. 11 is a cross-sectional view of a semiconductor device according to another embodiment.

Semiconductor device 1 of another embodiment is shown in FIG. 11. In this semiconductor device 1, metal film 21 is not formed on sidewall surface 20A of opening 19 of insulating layer 20, but metal film 21 is formed on surface 20B of insulating layer 20 under overhang portion 18' of gate electrode 18. In this case, gate electrode 18 also adheres to metal film 21, and gate electrode 18 fixed firmly can be formed. For this reason, in the lift-off process, when removing resist, gate electrode 18 can be prevented from being peeled off.

Figure 12:
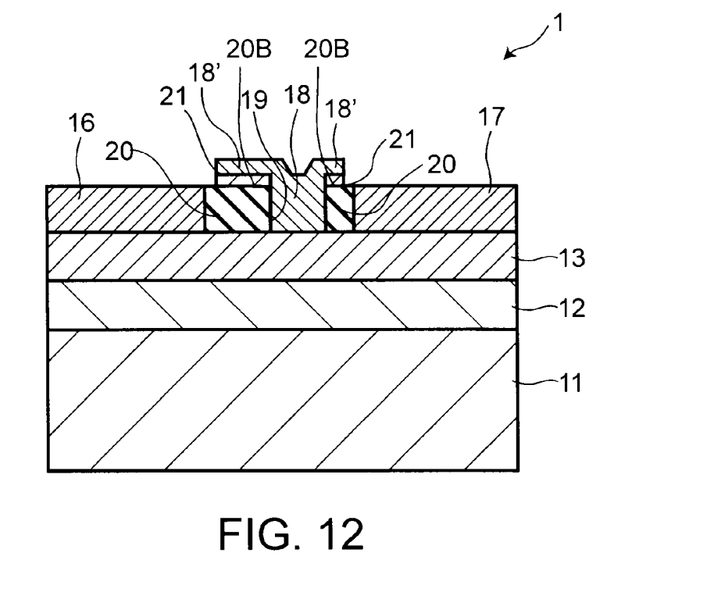
FIG. 12 is a cross-sectional view of a semiconductor device according to another embodiment.

Furthermore, semiconductor device 1 of another embodiment is shown in FIG. 12. In this semiconductor device 1, metal film 21 is not formed on sidewall surface 20A of opening 19 of insulating layer 20, but metal film 21 is formed on surface 20B of insulating layer 20 under overhang portion 18' of gate electrode 18. Like the embodiment shown in FIG. 10, overhang portion 18' of gate electrode 18 is asymmetrical with respect to center line B-B' of a region where gate electrode 18 and undoped AlGaN layer 13 contact. An overhang length of overhang portion 18' of drain electrode 16 side is formed longer than an overhang length of overhang section 18' of source electrode 17 side. In this embodiment, gate electrode 18 also adheres to metal film 21, and gate electrode 18 fixed firmly can be formed.

In the above-mentioned embodiment, Ni/Au was used as the material of gate electrode 18. But, when Pt/Au is used as the material for gate electrode 18, the same effect as the case where Ni/Au is used is also obtained.

Substrate 11 may be not only the SiC substrate but a sapphire substrate etc. which are generally used. Furthermore, GaN buffer layer 12 may be a deactivated buffer layer.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device comprising:
   a substrate;
   a buffer layer made of a material of a GaN system and formed on said substrate;
   an active layer made of a material of the GaN system and formed on said buffer layer;
   a drain electrode and a source electrode formed separately on said active layer and forming ohmic junctions with said active layer;
   an insulating layer formed between said drain electrode and said source electrode and formed with an opening;
   a gate electrode formed in said opening of said insulating layer and forming a Schottky barrier junction with said active layer; and
   a metal film formed on a surface of said insulating layer and adhering to said gate electrode.

2. The semiconductor device according to claim 1, wherein said metal film is formed on a sidewall surface of said opening of said insulating layer.

3. The semiconductor device according to claim 1, wherein said gate electrode has an overhang portion above said insulating layer and said metal film is formed between said overhang portion of said gate electrode and said insulating layer.

4. The semiconductor device according to claim 3, wherein said overhang portion of said gate electrode has a drain electrode side overhang portion and a source electrode side overhang portion, and an overhang length of said drain electrode side overhang portion is longer than an overhang length of said source electrode side overhang portion.

5. The semiconductor device according to any one of claim 1, 2, or 3, wherein said gate electrode is extended and formed on said buffer layer on which said active layer is not formed, and a width of said gate electrode formed on said buffer layer is wider than a width of said gate electrode formed on said active layer.

6. The semiconductor device according to any one of claims 1 to 3, wherein said gate electrode is formed with a material of either Ni/Au or Pt/Au.

7. A semiconductor device comprising:
   a substrate;
   a buffer layer made of a material of a GaN system formed on said substrate;
   an active layer made of a material of a GaN system formed on said buffer layer;
   a drain electrode and a source electrode formed separately on said active layer and form ohmic junctions with said active layer;
   an insulating layer formed between said drain electrode and said source electrode and formed with an opening;
   a gate electrode formed in said opening of said insulating layer and forming a Schottky barrier junction with said active layer; and
   a metal film formed on a sidewall surface of said opening of said insulating layer and adhering to said gate electrode.

8. A semiconductor device comprising:
   a substrate;
   a buffer layer made of a material of a GaN system formed on said substrate;
   an active layer made of a material of a GaN system formed on said buffer layer;
   a drain electrode and a source electrode formed separately on said active layer and forming ohmic junctions with said active layer;
   an insulating layer formed between said drain electrode and said source electrode and formed with an opening;
   a gate electrode formed in said opening of said insulating layer and forming a Schottky barrier junction with said active layer and having an overhang portion above said insulating layer; and
   a metal film formed on a sidewall surface of said opening of said insulating layer, and formed on a surface of said insulating layer between said overhang portion of said gate electrode and said insulating layer, and adhering to said gate electrode.

9. A semiconductor device comprising:
   a substrate;
   a buffer layer made of a material of a GaN system formed on said substrate;
   an active layer made of a material of a GaN system formed on said buffer layer;
   a drain electrode and a source electrode formed separately on said active layer and forming ohmic junctions with said active layer;
   an insulating layer formed between said drain electrode and said source electrode and formed with an opening,
   a gate electrode formed in said opening of said insulating layer and forming a Schottky barrier junction with said active layer, said gate electrode having a source electrode side overhang portion and a drain electrode side overhang portion having an overhang length longer than an overhang length of said source electrode side overhang portion above said insulating layer; and
   a metal film formed on a sidewall surface of said opening of said insulating layer and on a surface of said insulating layer between said drain electrode side overhang portion and said source electrode side overhang portion and said insulating layer, and adhering to said gate electrode.

10. A semiconductor device comprising:
    a substrate;
    a buffer layer made of a material of a GaN system formed on said substrate;
    an active layer made of a material of a GaN system formed on said buffer layer;
    a drain electrode and a source electrode formed separately on said active layer and forming ohmic junctions with said active layer;
    an insulating layer formed between said drain electrode and said source electrode and formed with an opening,
    a gate electrode formed in said opening of said insulating layer and forming a Schottky barrier junction with said active layer, and said gate electrode having an overhang portion above said insulating layer; and a metal film formed on a surface of said insulating layer between said overhang portion of said gate electrode and said insulating layer, and adhering to said gate electrode.

11. A semiconductor device comprising:

a substrate;

a buffer layer made of a material of a GaN system formed on said substrate;

an active layer which consists of a material of a GaN system formed on said buffer layer;

a drain electrode and a source electrode formed separately on said active layer and forming ohmic junctions with said active layer;

an insulating layer formed between said drain electrode and said source electrode and formed with an opening;

a gate electrode formed in said opening of said insulating layer and forming a Schottky barrier junction with said active layer, said gate electrode having a source electrode side overhang portion and a drain electrode side overhang portion having an overhang length longer than an overhang length of said source electrode side overhang portion above said insulating layer; and a metal film formed on the surface of said insulating layer between said source electrode side overhang portion and said drain electrode side overhang portion, and adhering to said gate electrode.

* * * * *